United States Patent
Woo et al.

(10) Patent No.: US 7,468,621 B2
(45) Date of Patent: Dec. 23, 2008

(54) SYNCHRONIZATION CIRCUITS AND METHODS

(75) Inventors: Jae-Hyuck Woo, Osan-si (KR); Jae-Goo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/441,610

(22) Filed: May 26, 2006

(65) Prior Publication Data

US 2006/0279348 A1    Dec. 14, 2006

(30) Foreign Application Priority Data

Jun. 14, 2005    (KR) ...................... 10-2005-0051120

(51) Int. Cl.
*H03K 3/00* (2006.01)
(52) U.S. Cl. ...................... 327/291; 327/292
(58) Field of Classification Search ............... None
See application file for complete search history.

(56) References Cited

U.S. PATENT DOCUMENTS 5,646,568 A * 7/1997 Sato ........................ 327/276
6,313,681 B1 * 11/2001 Yoshikawa ................. 327/277
7,112,995 B2 * 9/2006 Mentze et al. ............... 326/63

FOREIGN PATENT DOCUMENTS

| JP | 06067751 | 11/1994 |
| JP | 20000305528 | 2/2000 |
| KR | P1999-029900 | 4/1999 |
| KR | 20040039581 | 5/2004 |

OTHER PUBLICATIONS

English Abstract of Publication No. 06-067751.
English Abstract of Publication No. 2000-0305528.
English Abstract of Publication No. 20040039581.

* cited by examiner

*Primary Examiner*—Tuan Lam
*Assistant Examiner*—Hiep Nguyen
(74) *Attorney, Agent, or Firm*—F. Chau & Assoc., LLC

(57) ABSTRACT

A synchronization circuit includes a first level-shifting unit receiving an input reference signal having a first swing voltage and generating a first level change signal having a second swing voltage and a second level change signal having a third swing voltage, and a synchronization unit generating first and second output signals by synchronizing the first level change signal with the second level change signal.

27 Claims, 10 Drawing Sheets

SYNCHRONIZATION CIRCUITS AND METHODS

CROSS-REFERENCE TO RELATED PATENT APPLICATION

This application claims priority to Korean Patent Application No. 10-2005-0051120, filed on Jun. 14, 2005, the disclosure of which is herein incorporated by reference in its entirety.

BACKGROUND OF THE INVENTION

1. Technical Field

The present disclosure relates to synchronization circuits and methods and, more particularly, to synchronization circuits and methods for phase synchronization of output signals of two level shifters irrespective of variations in circuit manufacturing processes and the power supply voltages applied to the level shifters.

2. Discussion of the Related Art

Figure 1:
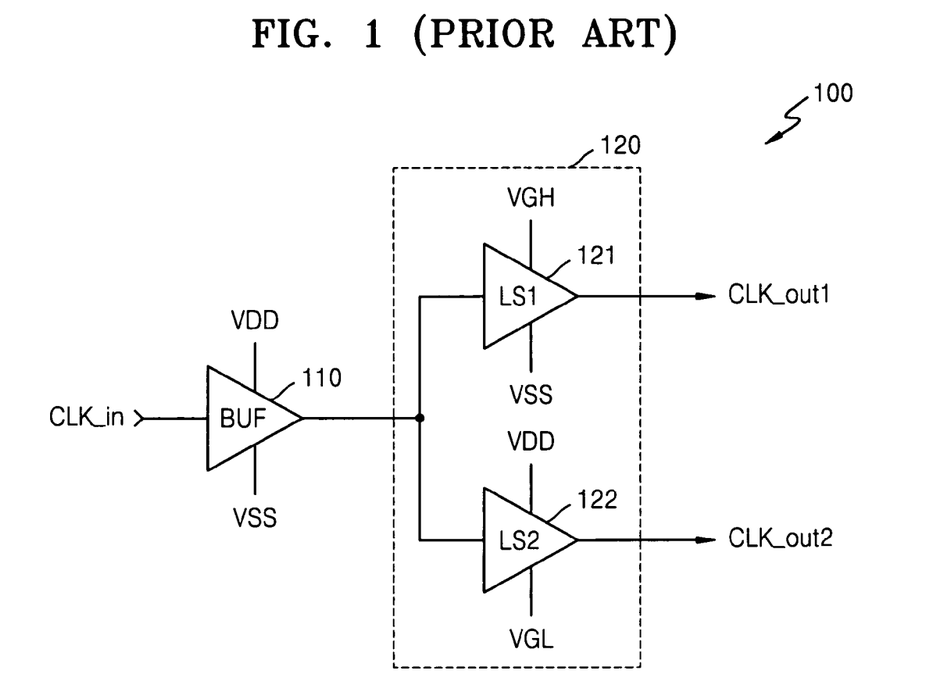
FIG. 1 is a block diagram of a conventional circuit generating two signals level-shifted from a reference signal.

FIG. 1 is a schematic diagram of a conventional circuit 100 for generating first and second level-shifted signals CLK_out1 and CLK_out2 from a reference signal CLK_in. Referring to FIG. 1, the circuit 100 includes a buffer 110 and a level shifting block 120. The buffer 110 improves the driving capability of the reference signal CLK_in and outputs the reference signal CLK_in. A second power supply voltage VDD and a third power supply voltage VSS are applied to the buffer 110. Accordingly, the maximum and minimum voltages between which the signal output from the buffer 110 swings are the second and third power supply voltages VDD and VSS.

The level shifting block 120 includes two level shifters 121 and 122. The first level shifter 121 receives the output signal from the buffer 110 and generates the first level-shifted signal CLK_out1 swinging between a first power supply voltage VGH and the third power supply voltage VSS. The first power supply voltage VGH is higher than the second power supply voltage VDD.

The second level shifter 122 receives the output signal from the buffer 110 and generates the second level-shifted signal CLK_out2 swinging between the second power supply voltage VDD and a fourth power supply voltage VGL. The fourth power supply voltage VGL is lower than the third power supply voltage VSS.

Figure 2:
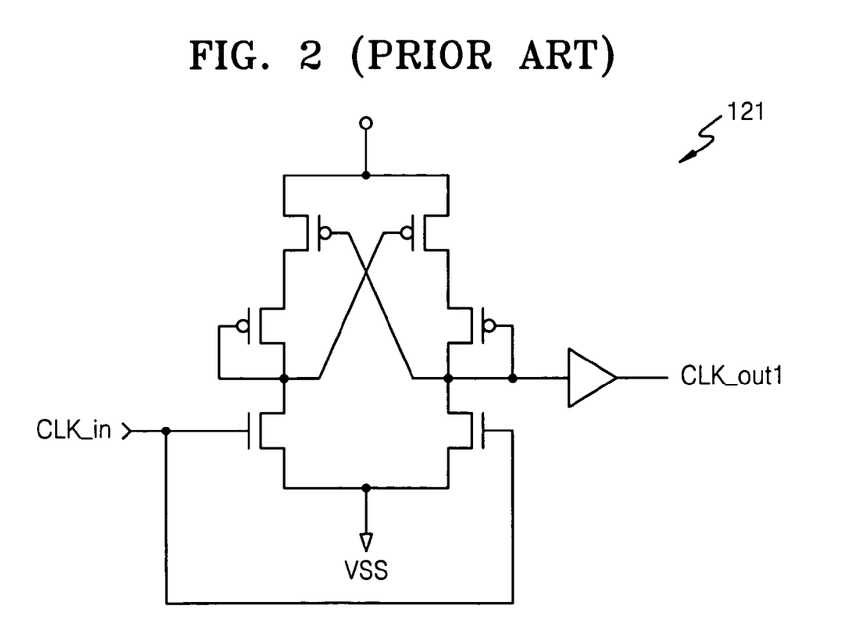
FIG. 2 is a circuit diagram of the first level shifter shown in FIG. 1.
Figure 3:
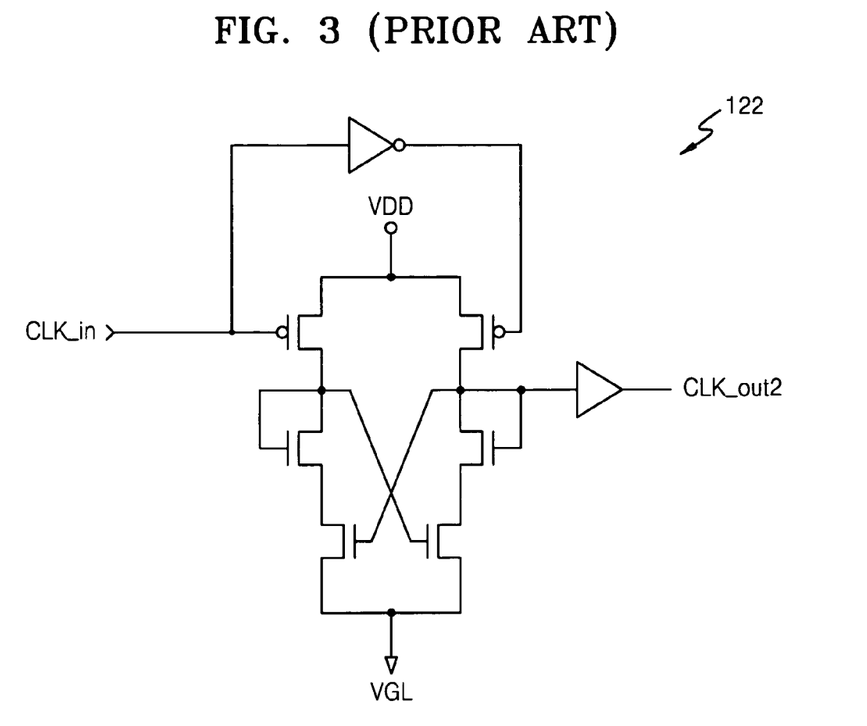
FIG. 3 is a circuit diagram of the second level shifter shown in FIG. 1.

FIG. 2 is a circuit diagram of the first level shifter 121, and FIG. 3 is a circuit diagram of the second level shifter 122. The first and second level shifters 121 and 122 shown in FIGS. 2 and 3, respectively, include a plurality of NMOS transistors and PMOS transistors. The on-off behavior of the NMOS and PMOS transistors is controlled by their threshold voltages. The threshold voltages can vary according to variations in circuit manufacturing processes. The variations in the threshold voltages change the electrical characteristics of the level shifters. In particular, delay or offset voltages of the first and second level-shifted signals output from the level shifters 121 and 122 relative to the input signals of the level shifters 121 and 122 may be increased. The first and second level shifters 121 and 122 are widely used so that further explanation thereof is omitted.

Figure 4:
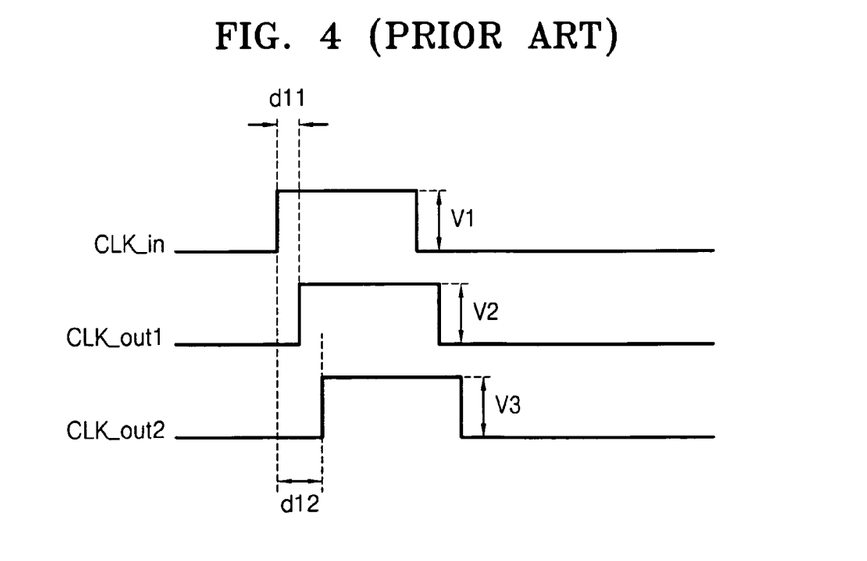
FIG. 4 is a timing diagram of input/output signals of the circuit generating level-shifted signals shown in FIG. 1.

FIG. 4 is a waveform diagram of the input and output signals of the circuit 100 for generating the level-shifted signals shown in FIG. 1. Referring to FIG. 4, the swing voltage of the reference signal CLK_in is V1, the swing voltage of the first level-shifted signal CLK_out1 is V2, and the swing voltage of the second level-shifted signal CLK_out2 is V3. The swing voltage V1 corresponds to the difference between the second power supply voltage VDD and the third power supply voltage VSS. The swing voltage V2 corresponds to the difference between the first power supply voltage VGH and the third power supply voltage VSS. The swing voltage V3 corresponds to the difference between the second power supply voltage VDD and the fourth power supply voltage VGL. Therefore, the swing voltages V1, V2 and V3 are at different voltages.

A delay d11 of the first level-shifted signal CLK_out1 generated using the reference signal CLK_in is different from a delay d12 of the second level-shifted signal CLK_out2 generated using the reference signal CLK_in.

The respective swing voltages V1, V2 and V3 are different because differing power supply voltages are applied to the buffer 110 and the first and second level shifters 121 and 122. Furthermore, the delay d11 differs from the delay d12 due to the different internal circuits of the first and second level shifters 121 and 122, the layout positions of the first and second level shifters 121 and 122 and variations in process parameters. The variations in process parameters are a result of a process variation of the PMOS and NMOS transistors. The variation in threshold voltage becomes a chief cause of the difference between the delay d11 of the first level-shifted signal CLK_out1 and the delay d12 of the second level-shifted signal CLK_out2.

The systems employing the circuit of FIG. 1 use the first and second level-shifted signals CLK_out1 and CLK_out2 output from the circuit on the assumption that the first and second level-shifted signals CLK_out1 and CLK_out2 have different voltages and the same phase. However, the operation of the system may be unstable due to the aforementioned phase discord.

SUMMARY OF THE INVENTION

According to an exemplary embodiment of the present invention, there is provided a synchronization circuit including a first level-shifting unit receiving an input reference signal having a first swing voltage and generating a first level change signal having a second swing voltage and a second level change signal having a third swing voltage, and a synchronization unit generating first and second output signals by synchronizing the first level change signal with the second level change signal.

According to an exemplary embodiment of the present invention, there is provided a synchronization circuit including a first level-shifting unit receiving an input reference signal and generating a first level change signal swinging between a second power supply voltage and a fourth power supply voltage and a second level change signal swinging between a first power supply voltage and a third power supply voltage, and a synchronization unit generating from the first and second level change signals a first output signal swinging between the first power supply voltage and the third power supply voltage and a second output signal swinging between the second power supply voltage and the fourth power supply voltage, wherein the first and second output signals have substantially the same phase.

According to an exemplary embodiment of the present invention, there is provided a synchronization circuit. The synchronization circuit includes: a first level-shifting unit changing the level of an input reference signal; a second level-shifting unit changing the level of an input reference signal; a third level-shifting unit changing the level of output signal from the second level-shifting unit; and a fourth level-shifting unit changing the level of output signal from the first level-shifting unit; wherein the first level-shifting unit and the third level-shifting unit are manufactured under substantially the same manufacturing condition, and wherein the second level-shifting unit and the fourth level-shifting unit are manufactured under substantially the same manufacturing condition.

According to an exemplary embodiment of the present invention, there is provided a synchronization circuit including a first delay circuit outputting a first delay signal delayed by a first delay from an input reference signal, a second delay circuit outputting a second delay signal delayed by a second delay from the input reference signal, and a synchronization unit generating first and second output signals from the first and second delay signals, wherein the phase of the first output signal is synchronized with the phase of the second output signal.

According to an exemplary embodiment of the present invention, there is provided a synchronization method including receiving an input reference signal swinging between a second power supply voltage and a third power supply voltage and generating a first level change signal swinging between the second power supply voltage and a fourth power supply voltage and a second level change signal swinging between a first power supply voltage and the third power supply voltage, and generating from the first and second level change signals a first output signal swinging between the first power supply voltage and the third power supply voltage and a second output signal swinging between the second power supply voltage and the fourth power supply voltage, the first and second output signals having substantially the same phase.

According to an exemplary embodiment of the present invention, there is provided a synchronization method including generating a first delay signal delayed by a first delay from an input reference signal, generating a second delay signal delayed by a second delay from the input reference signal, and generating first and second output signals from the first and second delay signals, wherein the phase of the first output signal is synchronized with the phase of the second output signal.

BRIEF DESCRIPTION OF THE DRAWINGS

The present invention will become readily apparent to those of ordinary skill in the art when descriptions of exemplary embodiments thereof are read with reference to the accompanying drawings.

DESCRIPTION OF EXEMPLARY EMBODIMENTS

Hereinafter, exemplary embodiments of the present invention will be described in detail with reference to the accompanying drawings. Like reference numerals refer to similar or identical elements throughout the description of the figures.

Figure 5:
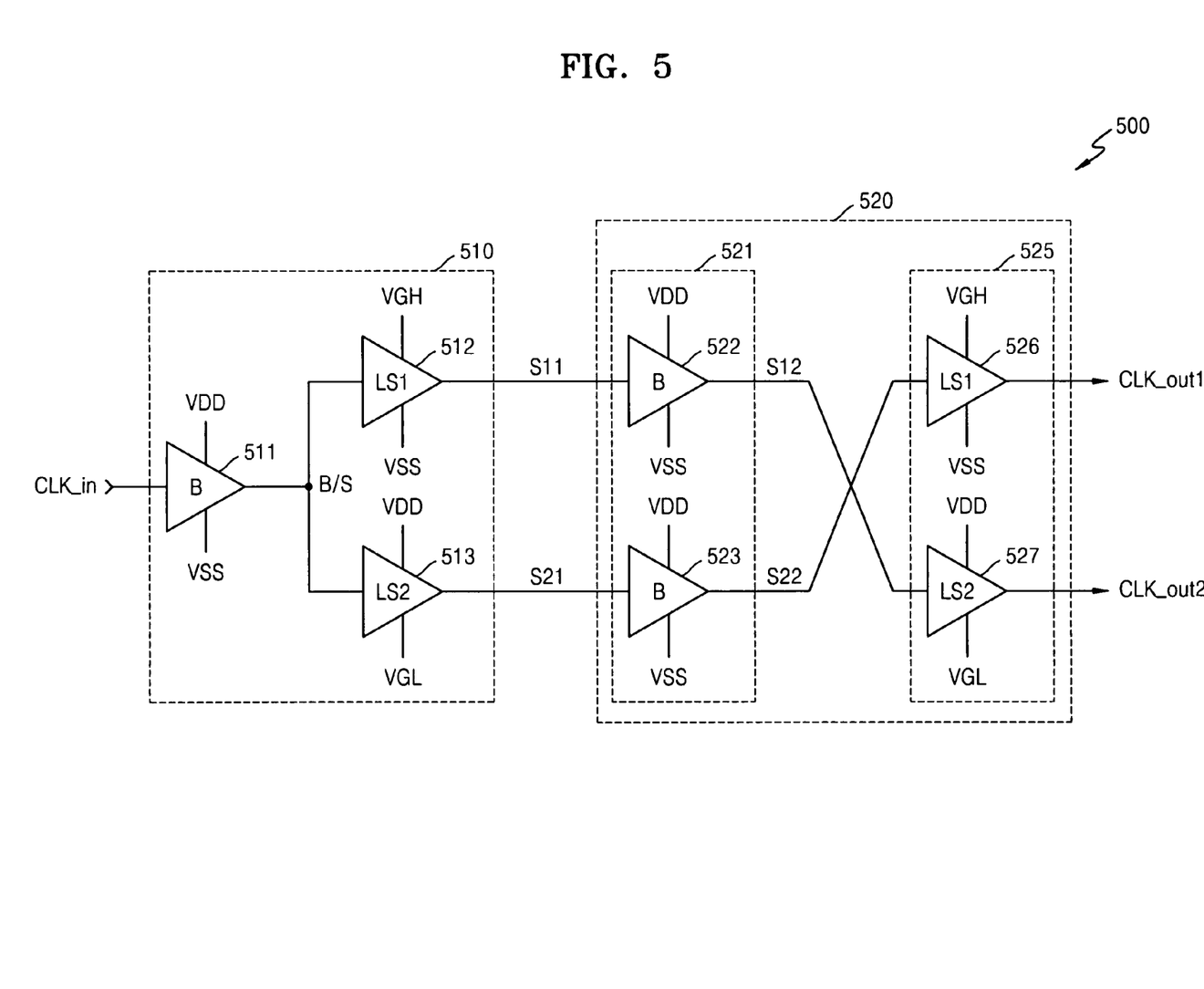
FIG. 5 is a block diagram of a synchronization circuit, according to an exemplary embodiment of the present invention.

FIG. 5 is a block diagram of a synchronization circuit 500 according to an exemplary embodiment of the present invention. Referring to FIG. 5, the synchronization circuit 500 includes a first level-shifting unit 510 and a synchronization unit 520. The first level-shifting unit 510 includes a first buffer 511, a first level shifter 512, and a second level shifter 513.

The first buffer 511 buffers a received input reference signal CLK_in and outputs a signal B/S. Second and third power supply voltages VDD and VSS, respectively, are applied to the first buffer 511. The difference between second power supply voltage VDD and third power supply voltage VSS is first swing voltage VSW1. The signal B/S swings between 0V and first swing voltage VSW1.

The first level shifter 512 outputs a first level change signal S11 after receiving the signal B/S. First power supply voltage VGH and third power supply voltage VSS are applied to the first level shifter 512. Accordingly, the first level change signal S11 swings between the first power supply voltage VGH and the third power supply voltage VSS. The difference between first power supply voltage VGH and third power supply voltage VSS is second swing voltage VSW2.

The second level shifter 513 outputs a second level change signal S21 after receiving the signal B/S. The second power supply voltage VDD and a fourth power supply voltage VGL are applied to the second level shifter 513. The second level change signal S21 swings between the second power supply voltage VDD and the fourth power supply voltage VGL. The difference between second power supply voltage VDD and fourth power supply voltage VGL is third swing voltage VSW3.

The synchronization unit 520 includes a buffer unit 521 and a second level-shifting unit 525. The buffer unit 521 includes a second buffer 522 and a third buffer 523.

The second buffer 522 buffers the first level change signal S11 and outputs a third level change signal S12. The second and third power supply voltages VDD and VSS are applied to the second buffer 522. Accordingly, the third level change signal S12 swings between the second power supply voltage VDD and the third power supply voltage VSS.

The third buffer 523 buffers the second level change signal S21 and outputs a fourth level change signal S22. The second and third power supply voltages VDD and VSS are applied to the third buffer 523. The fourth level change signal S22 swings between the second power supply voltage VDD and the third power supply voltage VSS.

In the relationship between the input signal and output signals, the second and third buffers 522 and 523 have substantially the same electrical characteristic. The internal circuits of the buffers 522 and 523 are shown in FIG. 6, and will be described later in this disclosure.

The second level-shifting unit 525 includes a third level shifter 526 and a fourth level shifter 527. The third level shifter 526 receives the fourth level change signal S22 and outputs a first output signal CLK_out1. The first and third power supply voltages VGH and VSS are applied to the third level shifter 526. The first output signal CLK_out1 swings between the first power supply voltage VGH and the third power supply voltage VSS.

The fourth level shifter 527 receives the third level change signal S12 and outputs a second output signal CLK_out2. The second and fourth power supply voltages VDD and VGL are applied to the fourth level shifter 527. The second output signal CLK_out2 swings between the second power supply voltage VDD and the fourth power supply voltage VGL.

Figure 6:
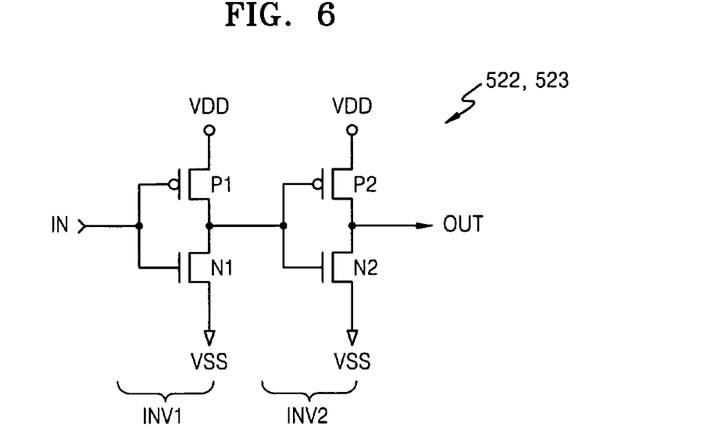
FIG. 6 is an equivalent circuit diagram of the buffers shown in FIG. 5.

FIG. 6 is an equivalent circuit diagram of the buffers shown in FIG. 5. Referring to FIG. 6, each of the second and third buffers 522 and 523 includes two inverters INV1 and INV2 that are connected in series. The first inverter INV1 comprises a PMOS transistor P1 and an NMOS transistor N1, and the second inverter INV2 comprises a PMOS transistor P2 and an NMOS transistor N2. When the driving capability of the PMOS transistor P1 of the first inverter INV1 is small, the driving capability of the NMOS transistor N1 is large, and when the driving capability of the PMOS transistor P2 is large, the driving capability of the NMOS transistor is small. The first and second inverters INV1 and INV2 complement each other such that the rising time and falling time of a signal can be appropriately controlled.

In such a case, for example, the second power supply voltage VDD is lower than the first power supply voltage VGH, the third power supply voltage VSS is lower than the second power supply voltage VDD, and the fourth power supply voltage VGL is lower than the third power supply voltage VSS.

Figure 7:
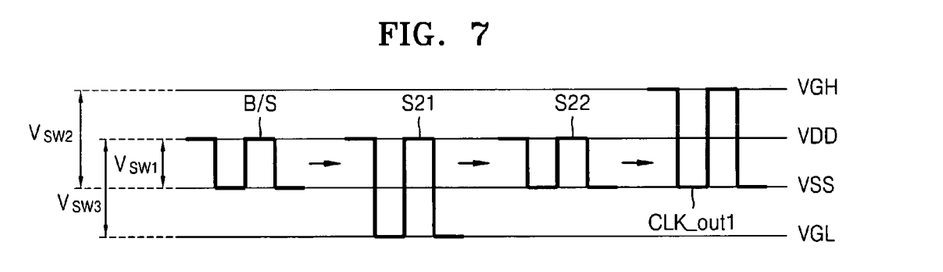
FIG. 7 illustrates a process of generating a first output signal using the synchronization circuit of FIG. 5, according to an exemplary embodiment of the present invention.

FIG. 7 illustrates a process of generating the first output signal CLK_out1 using the synchronization circuit of FIG. 5, according to an exemplary embodiment of the present invention. Referring to FIG. 7, the first square signal is the output signal B/S of the first buffer 511 and swings between the second power supply voltage VDD and the third power supply voltage VSS. The second square signal is the second level change signal S21 output from the second level shifter 513 and swings between the second power supply voltage VDD and the fourth power supply voltage VGL. The third square signal is the fourth level change signal S22 output from the third buffer 523 and swings between the second power supply voltage VDD and the third power supply voltage VSS. The fourth square signal is the first output signal CLK_out1 of the third level shifter 526 and swings between the first power supply voltage VGH and the third power supply voltage VSS.

Figure 8:
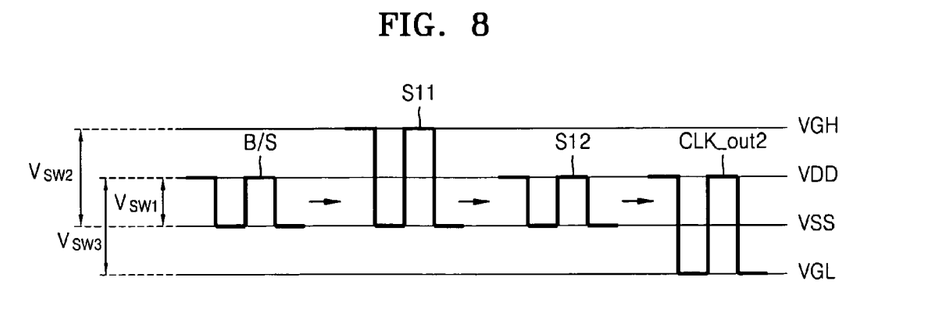
FIG. 8 illustrates a step of generating a second output signal using the synchronization circuit of FIG. 5, according to an exemplary embodiment of the present invention.

FIG. 8 illustrates a process of generating the second output signal CLK_out2 using the synchronization circuit of FIG. 5, according to an exemplary embodiment of the present invention. Referring to FIG. 8, the first square signal is the output signal B/S of the first buffer 511 and swings between the second power supply voltage VDD and the third power supply voltage VSS. The second square signal is the first level change signal S11 output from the first level shifter 512 and swings between the first power supply voltage VGH and the third power supply voltage VSS. The third square signal is the third level change signal S12 output from the second buffer 522 and swings between the second power supply voltage VDD and the third power supply voltage VSS. The fourth square signal is the second output signal CLK_out2 of the fourth level shifter 527 and swings between the second power supply voltage VDD and the fourth power supply voltage VGL.

Figure 9:
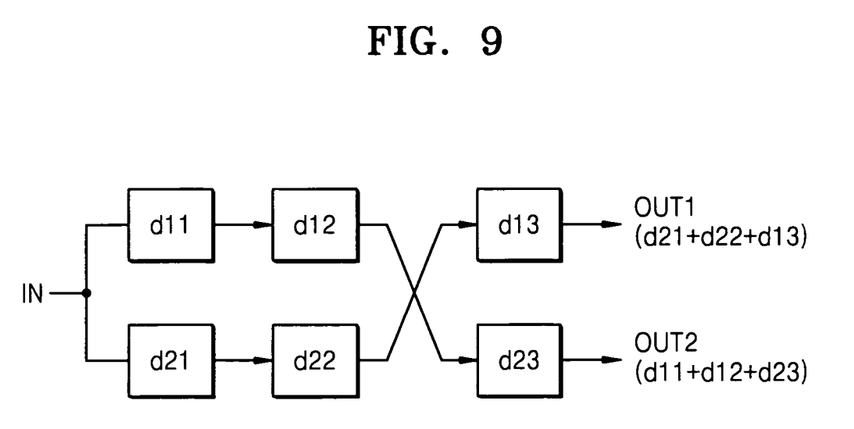
FIG. 9 is a block diagram showing delay characteristic of buffers and level shifters shown in FIG. 5.

FIG. 9 is a block diagram showing delay characteristics of the buffers and level shifters shown in FIG. 5. Referring to FIG. 9, the delay of the first level shifter 512 shown in FIG. 5 is d11 and the delay of the second level shifter 513 is d21. The delay of the second buffer 522 is d12 and the delay of the third buffer 523 is d22. The delay of the third level shifter 526 is d13 and the delay of the fourth level shifter 527 is d23. The total delay Del_out1 of a first output signal OUT1 with respect to an input signal IN and the total delay Del_out2 of a second output signal OUT2 with respect to the input signal IN can be represented as follows.

$$Del\_out1 = d21 + d22 + d13$$

$$Del\_out2 = d11 + d12 + d23$$

When the circuits and the layout of the first and third level shifters 512 and 526 are identical or nearly identical to each other, the delay d11 is substantially identical to the delay d13. Similarly, when the circuits and the layout of the second and fourth level shifters 513 and 527 are identical or nearly identical to each other, the delay d21 is substantially the same as the delay d23. When the buffers 522 and 523 are identical or nearly identical to each other, the delay d12 is substantially identical to the delay d22. According to an exemplary embodiment of the present invention, the total delay time Del_out1 of the first output signal OUT1 is substantially identical to the total delay time Del_out2 of the second output signal OUT2.

Figure 10:
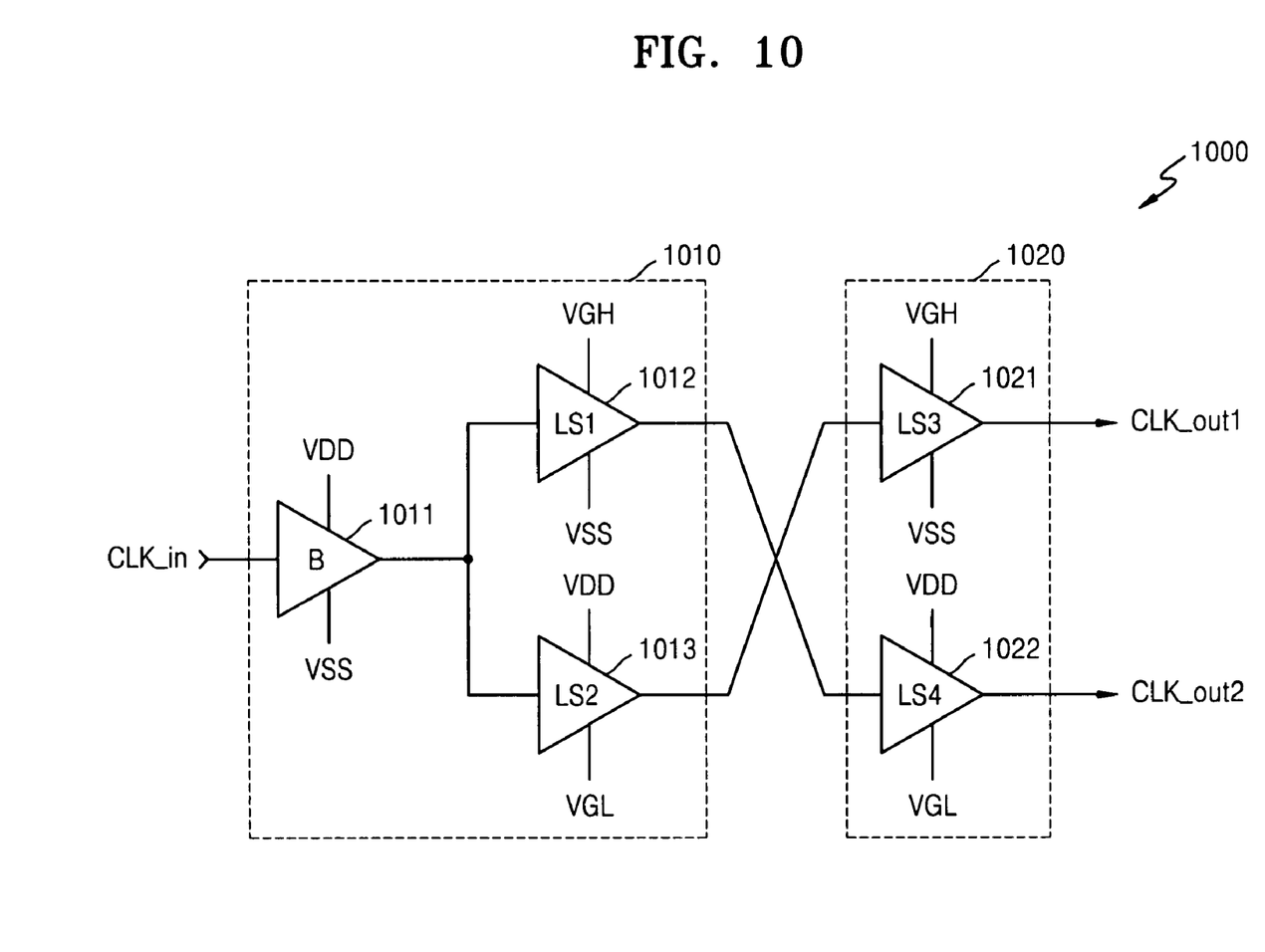
FIG. 10 is a block diagram of a synchronization circuit, according to an exemplary embodiment of the present invention.

FIG. 10 is a block diagram of a synchronization circuit 1000 according to an exemplary embodiment of the present invention. The synchronization circuit 1000 of FIG. 10 is identical to the synchronization circuit 500 of FIG. 5 except that a synchronization unit 1020 of the synchronization circuit 100 does not include the buffer unit 521. The synchronization circuit 1000 shown in FIG. 10 includes first, second, third and fourth level shifters 1012, 1013, 1021 and 1022. The first, second, third and fourth level shifters 1012, 1013, 1021 and 1022, respectively, may have different electrical characteristics. The first, second, third and fourth level shifters 1012, 1013, 1021 and 1022, respectively, may be designed such that the synchronization circuit 1000 can generate two signals in synchronization with each other. In an exemplary embodiment of the present invention, the first, second, third and fourth level shifters 1012, 1013, 1021 and 1022, respectively, are designed according to their manufacturing processes and power supply voltages applied to them such that the synchronization circuit 1000 can generate two signals in synchronization with each other.

Hereinafter, the first and second output signals CLK_out1 and CLK_out2 generated by the synchronization circuit according to an exemplary embodiment of the present invention will be compared to the first and second level-shifted signals generated by the conventional synchronization circuit with reference to FIGS. 11, 12, 13 and 14. In the figures, first and second level-shifted signals CLK_out1 and CLK_out2 of FIG. 11 correspond to the first and second output signals CLK_out1 and CLK_out2 of FIG. 12.

Figure 11:
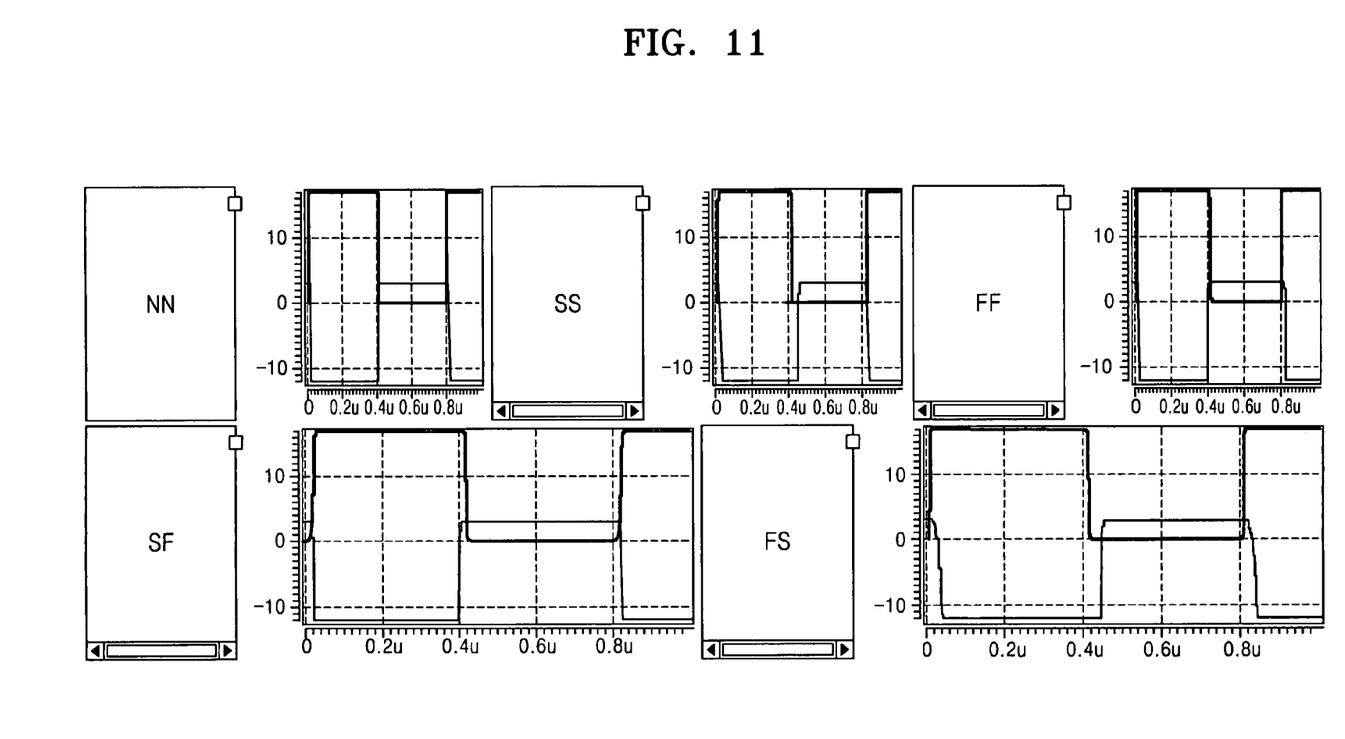
FIG. 11 shows waveforms of first and second level-shifted signals CLK_out1 and CLK_out2 measured while varying the sizes of the transistors constructing the circuit of FIG. 1.

FIG. 11 shows waveforms of the first and second level-shifted signals CLK_out1 and CLK_out2 measured while varying the sizes of the transistors included in the conventional circuit 100 of FIG. 1. In FIG. 11, "N" represents that the size of a MOS transistor is normal, "S" represents that the MOS transistor is scaled to a size smaller than the normal size, and "F" represents that the MOS transistor is scaled to a size larger than the normal size. As used herein, size refers to the length-to-width ratio (W/L) of the gate of a MOS transistor, and scaling is to reduce or increase the length L and width W of the gate without varying the length-to-width ratio. When a MOS transistor is scaled to a size smaller than the normal size, a small amount of current flows and the operating speed of the MOS transistor is decreased. On the other hand, when a MOS transistor is scaled to a size larger than the normal size, a large amount of current flows and the operating speed of the MOS transistor is increased.

In FIG. 11, the first letter representing the size is for an NMOS transistor and the second letter is for a PMOS transistor. For example, "NN" means that NMOS and PMOS transistors are manufactured in the normal size, "SS" means that the NMOS and PMOS transistors are scaled to a size smaller than the normal size, and "FF" means that the NMOS and PMOS transistors are scaled to a size larger than the normal size. For example, "SF" means that the NMOS transistor is scaled to a size smaller than the normal size while the PMOS transistor is scaled to a size larger than the normal size, and "FS" means that the NMOS transistor is scaled to a size larger than the normal size while the PMOS transistor is scaled to a size smaller than the normal size.

Referring to FIG. 11, in the case of SS, FF, SF and FS (but not NN), for example, the first level-shifted signal CLK_out1, which has a higher voltage than the second level-shifted signal CLK_out2, is not synchronized with the second level-shifted signal CLK_out2. The first and second level-shifted signals CLK_out1 and CLK_out2 have different phases because the phase of one of the two signals has been inverted to easily compare the two signals to each other.

Figure 12:
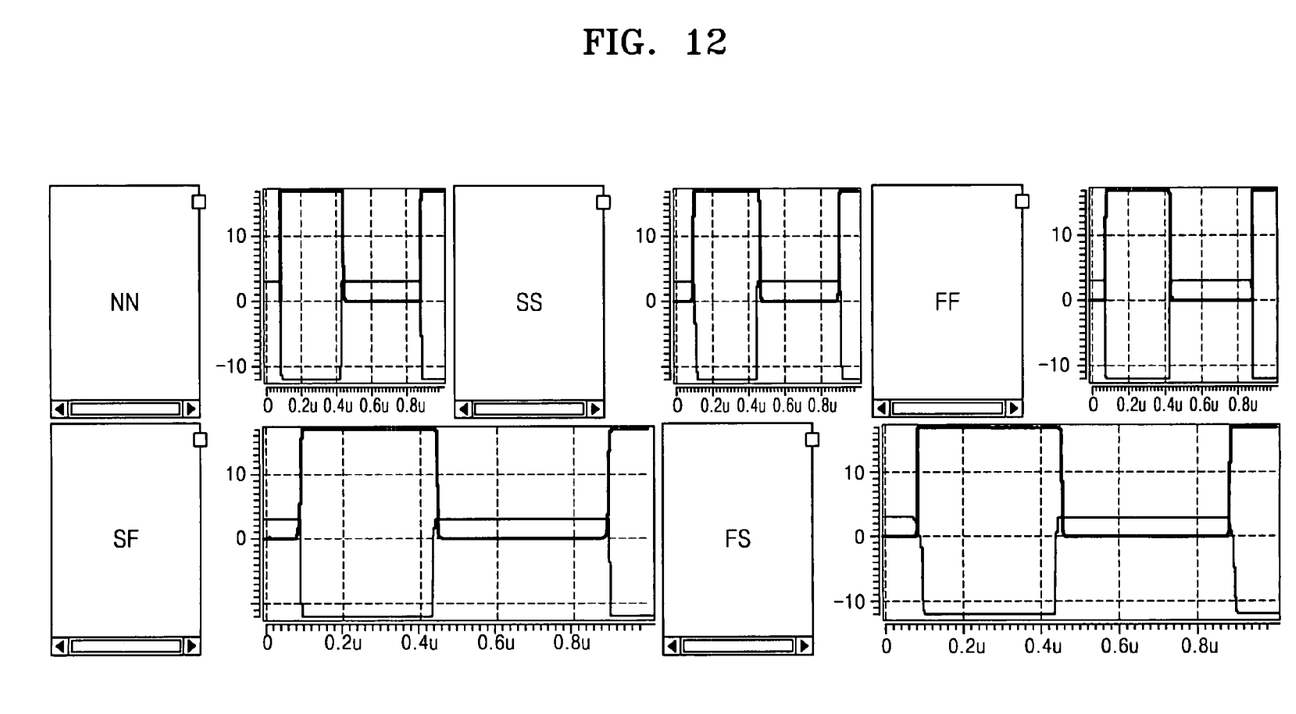
FIG. 12 shows waveforms of first and second output signals CLK_out1 and CLK_out2 measured while varying the sizes of transistors constructing the circuit of FIG. 5, according to an exemplary embodiment of the present invention.

FIG. 12 shows waveforms of the first and second output signals CLK_out1 and CLK_out2, measured while varying the sizes of transistors included in the circuit of FIG. 5, according to an exemplary embodiment of the present invention. Referring to FIG. 12, in the case of NN, SS, FF, SF and FS, for example, the first and second output signals CLK_out1 and CLK_out2 are synchronized with each other.

Figure 13:
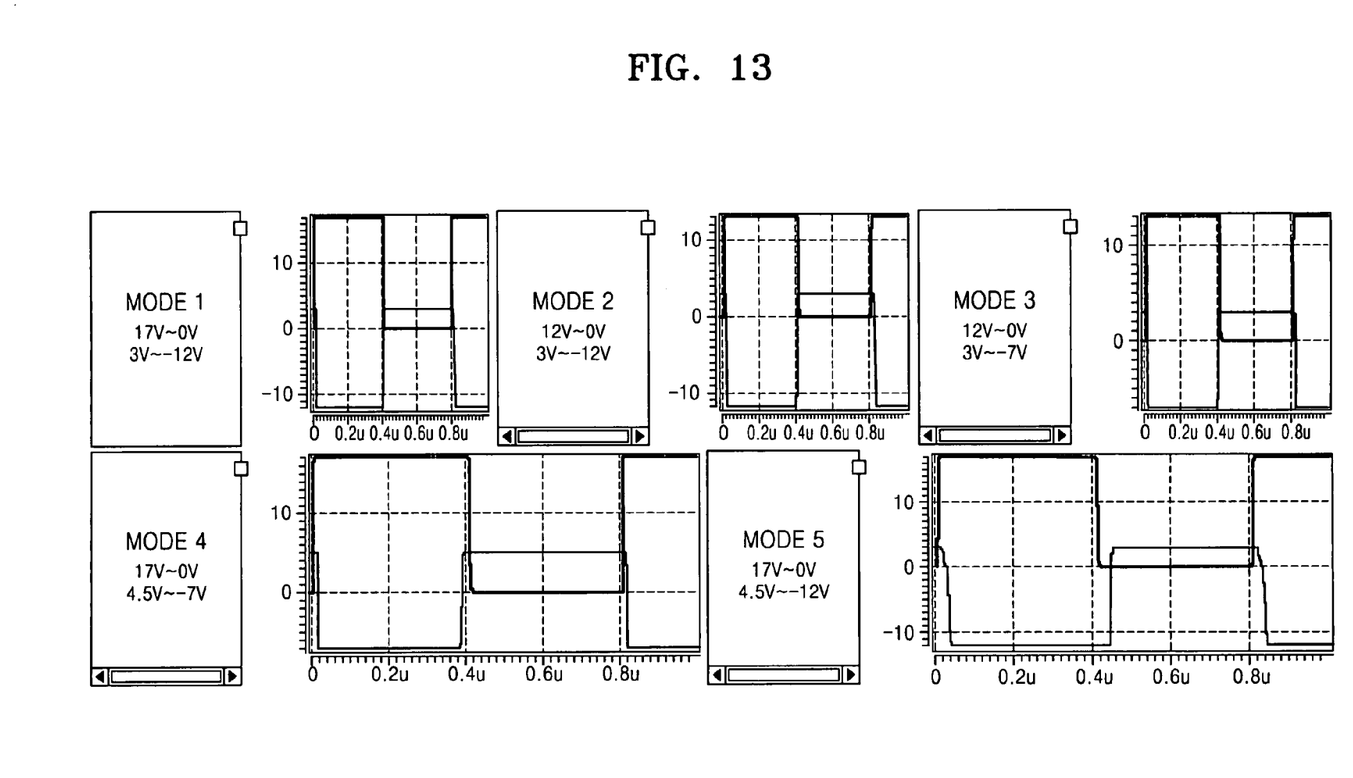
FIG. 13 shows waveforms of the first and second level-shifted signals CLK_out1 and CLK_out2 measured while varying the four power supply voltages supplied to the circuit of FIG. 1.

FIG. 13 shows waveforms of the first and second level-shifted signals CLK_out1 and CLK_out2 measured while varying the four power supply voltages supplied to the circuit of FIG. 1. Measurements were carried out in the first through fifth modes MODE 1 to MODE 5 as shown in FIGS. 13 and 14.

In the first mode MODE 1, the first and third power supply voltages VGH and VSS applied to the first level shifter 121 are, e.g., 17V and 0V, respectively, and the second and fourth power supply voltages VDD and VGL applied to the second level shifter 122 are, e.g., 3V and −12V, respectively. In the second mode MODE 2, the first power supply voltage VGH applied to the first level shifter 121 is, e.g., 12V. In the third mode MODE 3, the fourth power supply voltage VGL applied to the second level shifter 122 is, e.g., −7V. In the fourth mode MODE 4, the second and fourth power supply voltages VDD and VGL applied to the second level shifter 122 are, e.g., 4.5V and −7V, respectively. In the fifth mode MODE 5, the fourth power supply voltage VGL applied to the second level shifter 122 is, e.g., −12V.

Referring to FIG. 13, among the five modes, there are modes (e.g., MODE 1, MODE 2 and MODE 3) in which the two signals are not synchronized with each other, while there are other modes (e.g., MODE 4 and MODE 5) in which the two signals are synchronized with each other.

Figure 14:
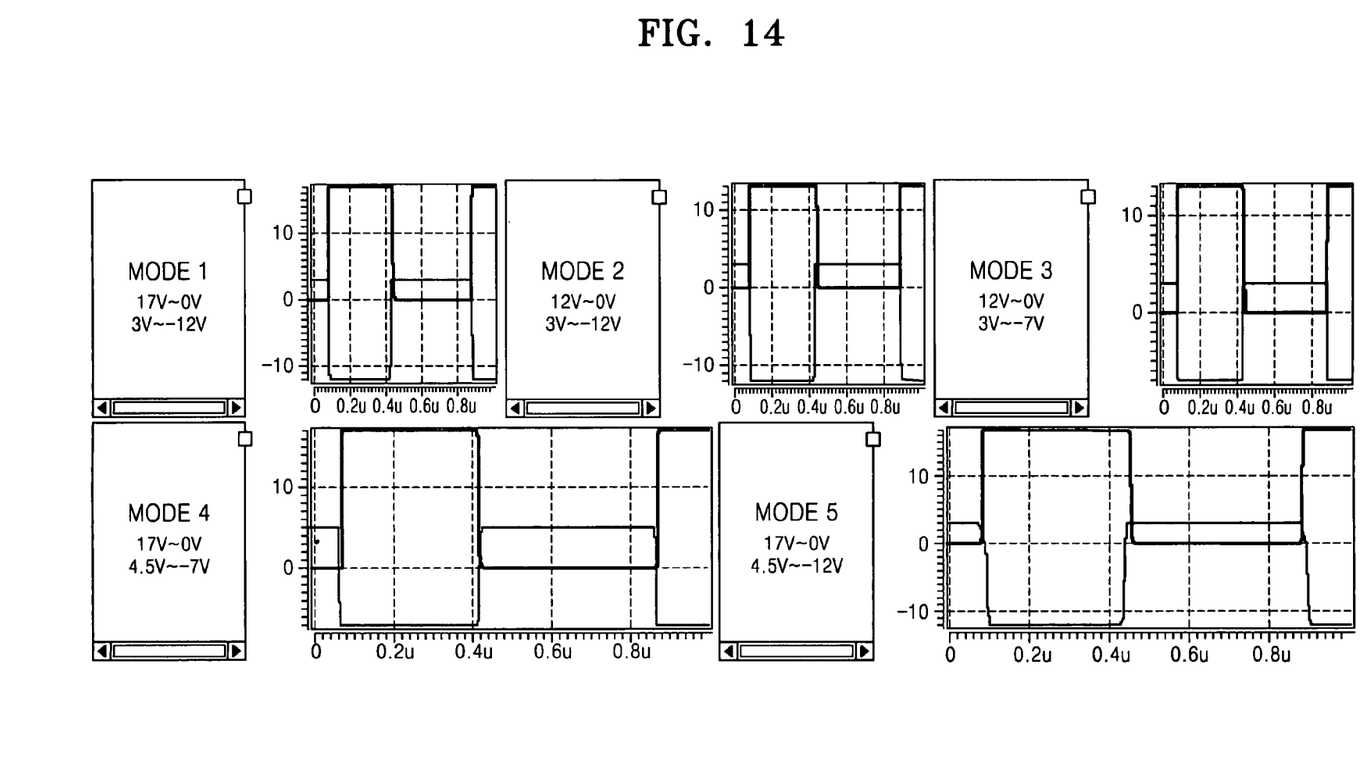
FIG. 14 shows waveforms of the first and second and output signals CLK_out1 and CLK_out2 measured while varying four power supply voltages supplied to the circuit of FIG. 5.

FIG. 14 shows waveforms of the first and second output signals CLK_out1 and CLK_out2 measured while varying the four power supply voltages supplied to the circuit of FIG. 5. It can be seen from FIG. 14, for example, that the two signals are synchronized with each other in all of the five modes.

As described above, synchronization circuits and methods according to exemplary embodiments of the present invention can generate signals having different voltages and substantially the same phase irrespective of process parameter variations or power supply voltages applied to the level shifters.

Although the exemplary embodiments of the present invention have been described in detail with reference to the accompanying drawings for the purpose of illustration, it is to be understood that the inventive processes and apparatus are not be construed as limited thereby. It will be readily apparent to those of reasonable skill in the art that various modifications to the foregoing exemplary embodiments can be made without departing from the scope of the invention as defined by the appended claims, with equivalents of the claims to be included therein.

What is claimed is:

1. A synchronization circuit comprising:
a first level-shifting unit receiving an input reference signal having a first swing voltage and generating a first level change signal having a second swing voltage and a second level change signal having a third swing voltage, wherein peak-to-peak voltage of the first swing voltage is smaller than peak-to-peak voltage of one of the second and third swing voltages; and
a synchronization unit generating first and second output signals by buffering and level shifting the first and second level change signals, wherein the first and second output signals have substantially the same phase.

2. The synchronization circuit of claim 1, wherein the first level-shifting unit comprises:
a first buffer receiving the input reference signal and outputting a buffer output signal having the first swing voltage;
a first level shifter generating the first level change signal from the buffer output signal; and
a second level shifter generating the second level change signal from the buffer output signal.

3. The synchronization circuit of claim 2, wherein the synchronization unit comprises:
a buffer unit generating a third level change signal from the first level change signal and generating a fourth level change signal from the second level change signal, wherein the third and fourth level change signals have the first swing voltage; and a second level=shifting unit generating the first output signal from the fourth level change signal and generating the second output signal from the third level change signal.

4. The synchronization circuit of claim 3, wherein the buffer unit comprises:
a second buffer receiving the first level change signal and outputting the third level change signal; and
a third buffer receiving the second level change signal and outputting the fourth level change signal.

5. The synchronization circuit of claim 4, wherein the second and third buffer output signals have substantially the same swing voltage.

6. The synchronization circuit of claim 3, wherein the second level-shifting unit comprises:
a third level shifter receiving the fourth level change signal and outputting the first output signal; and
a fourth level shifter receiving the third level change signal and outputting the second output signal.

7. The synchronization circuit of claim 6, wherein the first output signal output from the third level shifter and the first level change signal output from the first level shifter have substantially the same swing voltage, and the second output signal output from the fourth level shifter and the second level change signal output from the second level shifter have substantially the same swing voltage.

8. The synchronization circuit of claim 2, wherein the synchronization unit comprises:
a third level shifter generating the first output signal from the second level change signal; and
a fourth level shifter generating the second output signal from the first level change signal.

9. A synchronization circuit comprising:
a first level-shifting unit receiving an input reference signal and generating a first level change signal swinging between a second power supply voltage and a fourth power supply voltage and a second level change signal swinging between a first power supply voltage and a third power supply voltage; and
a synchronization unit generating from the first and second level change signals a first output signal swinging between the first power supply voltage and the third power supply voltage and a second output signal swinging between the second power supply voltage and the fourth power supply voltage, wherein the first and second output signals have substantially the same phase.

10. The synchronization circuit of claim 9, wherein the first level-shifting unit comprises:
a first buffer which is driven by the second and third power supply voltages, wherein the first buffer receives the input reference signal and outputs a buffer signal swinging between the second power supply voltage and the third power supply voltage;
a first level shifter which is driven by the first and third power supply voltages, wherein the first level shifter receives the buffer signal and outputs the first level change signal; and
a second level shifter which is driven by the second and fourth power supply voltages, wherein the second level shifter receives the buffer signal and outputs the second level change signal.

11. The synchronization circuit of claim 10, wherein the synchronization unit comprises:
a buffer unit receiving the first and second level change signals and outputting third and fourth level change signals swinging between the second power supply voltage and the third power supply voltage; and
a second level-shifting unit receiving the third and fourth level change signals and outputting the first and second output signals.

12. The synchronization circuit of claim 11, wherein the buffer unit comprises:
a second buffer which is driven by the second and third power supply voltages, wherein the second buffer receives the first level change signal and outputs the third level change signal; and
a third buffer which is driven by the second and third power supply voltages, wherein the third buffer receives the second level change signal and outputs the fourth level change signal.

13. The synchronization circuit of claim 12, wherein the second and third buffers have substantially the same driving capability, substantially the same delay time, substantially the same rising time and substantially the same falling time.

14. The synchronization circuit of claim 11, wherein the second level-shifting unit comprises:
a third level shifter which is driven by the first and third power supply voltages, wherein the third level shifter receives the fourth level change signal and outputs the first output signal; and
a fourth level shifter which is driven by the second and fourth power supply voltages, wherein the fourth level shifter receives the third level change signal and outputs the second output signal.

15. The synchronization circuit of claim 14, wherein power supply voltages applied to the third level shifter are substantially identical to power supply voltages applied to the first level shifter, and power supply voltages applied to the fourth level shifter are substantially identical to power supply voltages applied to the second level shifter.

16. The synchronization circuit of claim 9, wherein the synchronization unit comprises:
a first level shifter which is driven by the first and third power supply voltages, wherein the first level shifter generates the first output signal from the second level change signal; and
a second level shifter which is driven by the second and fourth power supply voltages, wherein the second level shifter generates the second output signal from the first level change signal.

17. The synchronization circuit of claim 9, wherein the second power supply voltage is less than the first power supply voltage, wherein the third power supply voltage is less than the second power supply voltage, and wherein the fourth power supply voltage is less than the third power supply voltage.

18. A synchronization circuit comprising:
a first level-shifting unit changing the level of an input reference signal;
a second level-shifting unit changing the level of the input reference signal;
a third level-shifting unit changing the level of an output signal from the second level-shifting unit; and
a fourth level-shifting unit changing the level of an output signal from the first level-shifting unit,
wherein the first level-shifting unit and the third level-shifting unit are manufactured under substantially the same manufacturing condition, and
wherein the second level-shifting unit and the fourth level-shifting unit are manufactured under substantially the same manufacturing condition.

19. The synchronization circuit of claim 18, further comprising:
a first buffer buffering an output signal from the first level-shifting unit and outputting the buffered signal to the fourth level-shifting unit; and
a second buffer buffering an output signal from the second level-shifting unit and outputting the buffered signal to the third level-shifting unit,
wherein the first buffer and the second buffer are manufactured under substantially the same manufacturing condition.

20. The synchronization circuit of claim 1,
wherein the first level-shifting unit comprises:
a first delay circuit outputting the first level change signal delayed by a first delay from the input reference signal; and a second delay circuit outputting the second level change signal delayed by a second delay from the input reference signal, wherein the synchronization unit comprises:

a third delay circuit outputting the first output signal delayed by the first delay from the second level change signal; and a fourth delay circuit outputting the second output signal delayed by the second delay from the first level change signal;

wherein circuits and layouts of the first delay circuit and the third delay circuit are substantially the same and provide substantially the same delays, and wherein circuits and layouts of the second delay circuit and the fourth delay circuit are substantially the same and provide substantially the same delays.

21. The synchronization circuit of claim 20, further comprising:

a fifth delay circuit outputting a fifth delay signal delayed by a fifth delay from the first level change signal; and a sixth delay circuit outputting a sixth delay signal delayed by a sixth delay from the second level change signal, wherein the fifth delay circuit and the sixth delay circuit are manufactured under substantially the same manufacturing condition, 22. The synchronization circuit of claim 1, wherein the first level-shifting unit comprises:

a first delay circuit outputting the first level change signal delayed by a first delay from the input reference signal; and a second delay circuit outputting the second level change signal delayed by a second delay from the input reference signal;

wherein the synchronization unit comprises:

a third delay circuit outputting a third level change signal delayed by a third delay from the first level change signal;

a fourth delay circuit outputting a fourth level change signal delayed by a fourth delay from the second level change signal;

a fifth delay circuit outputting the first output signal delayed by a fifth delay from the fourth level change signal; and a sixth delay circuit outputting the second output delay signal delayed by a sixth delay from the third level change signal, wherein the fifth delay is substantially identical to the first delay, and wherein the sixth delay is substantially identical to the second delay.

23. The synchronization circuit of claim 22 wherein the third delay is substantially identical to the fourth delay, and wherein the first delay is different from the second delay.

24. A synchronization method comprising:

receiving an input reference signal swinging between a second power supply voltage and a third power supply voltage and generating a first level change signal swinging between the second power supply voltage and a fourth power supply voltage and a second level change signal swinging between a first power supply voltage and the third power supply voltage; and generating from the first and second level change signals a first output signal swinging between the first power supply voltage and the third power supply voltage and a second output signal swinging between the second power supply voltage and the fourth power supply voltage, the first and second output signals having substantially the same phase.

25. The synchronization method of claim 24, wherein the step of generating the first and second level change signals comprises:

generating from the input reference signal a buffer signal swinging between the second power supply voltage and the third power supply voltage;

generating the first level change signal from the buffer signal; and generating the second level change signal from the buffer signal.

26. The synchronization method of claim 24, wherein the step of generating the first and second output signals comprises:

generating a third level change signal from the first level change signal;

generating a fourth level change signal from the second level change signal;

generating the first output signal from the fourth level change signal; and generating the second output signal from the third level change signal.

27. The synchronization method of claim 24, wherein the second power supply voltage is less than the first power supply voltage, wherein the third power supply voltage is less than the second power supply voltage, and wherein the fourth power supply voltage is less than the third power supply voltage.

* * * * *